Figure 1:
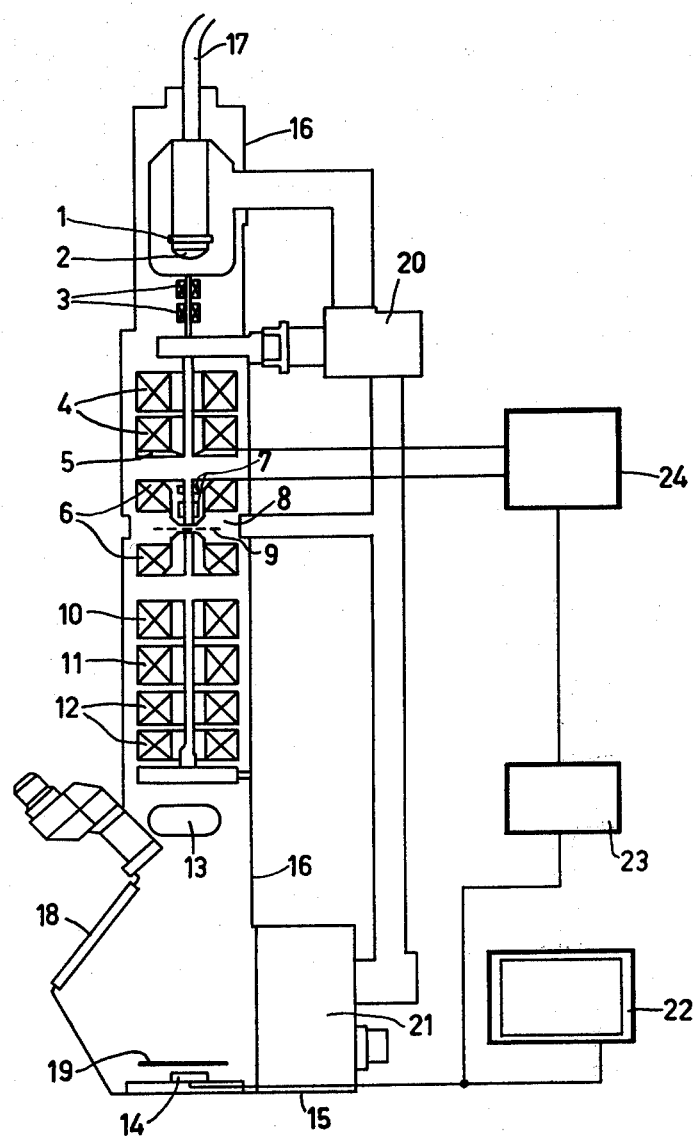

United States Patent [19]

Bouwhuis et al.

[11] 4,379,230
[45] Apr. 5, 1983

[54] AUTOMATIC BEAM CORRECTION IN A SCANNING TRANSMISSION ELECTRON MICROSCOPE

[75] Inventors: Gijsbertus Bouwhuis, Eindhoven; Hendrik De Lang, Heeze; Nicolaas H. Dekkers, Eindhoven, all of Netherlands

[73] Assignee: U.S. Philips Corporation, New York, N.Y.

[21] Appl. No.: 184,561

[22] Filed: Sep. 5, 1980

[30] Foreign Application Priority Data

Sep. 5, 1979 [NL] Netherlands .......................... 7906632

[51] Int. Cl.³ .......................... G01N 23/00; H01J 37/26
[52] U.S. Cl. .................................... 250/307; 250/311
[58] Field of Search .................. 250/311, 310, 396 R, 250/357, 307; 313/361

[56] References Cited

U.S. PATENT DOCUMENTS

| | | | |
|---|---|---|---|
| 3,576,438 | 4/1971 | Pease | 250/311 |
| 3,833,811 | 9/1974 | Koike et al. | 250/311 |
| 4,038,543 | 7/1977 | Krisch et al. | 250/311 |
| 4,162,403 | 7/1979 | Baumgarten | 250/311 |
| 4,214,163 | 7/1980 | Namae et al. | 250/311 |

*Primary Examiner*—Bruce C. Anderson
*Attorney, Agent, or Firm*—Paul R. Miller

[57] ABSTRACT

In a scanning electron microscope, a periodic structure in the object plane is used for the detection of the focus condition of a spot-focussed electron beam scanning an object in order to correct defocusing and astigmatism in the scanning electron beam spot. To achieve this the detector comprises a plurality of individual elements which can be pair-wise read and an electronic circuit for forming a control signal for controlling the excitation of a spot-forming lens and a stigmator, respectively, from signals representing movement of the electron interference pattern at the detector, relative to the object scan, due to an out of focus condition. The signals are derived from corresponding pairs of detector elements which are situated at a fixed distance from each other in order to correct the focus and compensate for the astigmatism in the electron beam respectively. In the case of astimatism, signals from at least two pairs of detector elements spaced in directions at right-angles to one another, are used.

11 Claims, 3 Drawing Figures

AUTOMATIC BEAM CORRECTION IN A SCANNING TRANSMISSION ELECTRON MICROSCOPE

The invention relates to an electron microscope comprising, arranged along and around an electron-optical axis, an electron-optical lens system, including a stigmator, a beam scanning device for scanning an object by means of an electron beam spot focussed on an object plane and a detector for detecting electrons after passing through the object.

An electron microscope of this kind is known from U.S. Pat. No. 3,833,811. In an electron microscope described therein, an object is scanned and electrons penetrating through the object are detected.

From measurements made from an image thus formed, signals are recovered for the adjustment of the focus of the condensor lens and the astigmatism of the stigmator.

Images detected by two different detectors are displayed on a monitor and the two images are made to coincide by readjustment of the excitation of the electron-optical elements, so that optimum adjustment of the electron beam is achieved. This method has a drawback in that for the microscopist it is frequently or continually necessary to readjust the lens current, for which purpose further measurements must be performed. Thus, a substantial amount of time is lost in practice and an object often has to be irradiated for a substantial part of the time simply for the purpose of adjusting the lenses. Object contamination occurring during adjustment often impedes execution of an actual observation.

The invention has for an object to mitigate these drawbacks. According to the invention there is provided a method of automatic focus and/or astigmatism correction in an electron microscope, characterized by the steps of: scanning an object structure located in the object plane of the electron microscope with a nominally spot-focussed electron beam so that a corresponding electron interference pattern caused by the interaction of the object structure with the incident electron beam, is formed in the detector plane and is, in general, displaced over the detector in response to the object scan, sensing in the electron intensity at a plurality of individual spaced locations in the detector plane and processing the corresponding sensed signals by at least comparing signals from a pair of spaced locations to determine a displacement of the electron intensity pattern over the detector plane with reference to the applied object scan, and generating in response to the determination, a correction control signal, and applying the correction control signal to correct the energization of an electron-optical element of the electron microscope so as to provide an optimum focus condition and/or a predetermined amount of astigmatism correction to the electron beam spot scanning the object plane. In further accordance with the invention there is provided an electron microscope including an electron-optical lens system including a stigmator, a beam scanning device for scanning an object with an electron beam spot-focussed on an object plane by means of at least a part of the electron-optical lens system, and a detector for detecting electrons after passing through the object, characterized in that a structured object is located in the object plane, the detector comprises a plurality of individual detector elements arranged to provide independent electrical output signals, and there is provided electrical control circuit means connected to the detector elements and arranged at least to compare the output signals from a spaced pair of detector elements so as to determine the movement of an electron intensity pattern present in the detector plane, in a direction from one element to the other, with reference to a corresponding applied electron beam scan of the structured object, and to generate in response to the determination at least one correction control signal to control the energization of a corresponding electron-optical element operative on the electron beam before the object plane so as to provide an optimum focus condition and/or a predetermined amount of astigmatism correction.

Because the setting of the relevant lenses and the stigmator is continuously automatically optimized in an electron microscope in accordance with the invention, additional irradiation of the object is not necessary. The subdivided detector is also used for the actual signal detection, so that no elements have to be added to the electron microscope for the adjustment. The introduction of additional inaccuracies or disturbances is thus also precluded.

In one embodiment of the electron microscope, the detector comprises two detector elements which are situated in the same detector half at a given distance from each other and which serve for measuring a signal which is a measure of the defocusing of a relevant lens of the object-scanning-spot focussing part of the electron-optical system.

In a further embodiment, the detector comprises several pairs of detector elements in order to obtain signals which are a measure of the astigmatism in the electron beam and whereby the astigmatism can be minimized by readjustment of the stigmator.

Defocusing and astigmatism are preferably automatically corrected simultaneously, for example, by means of a suitably programmed microprocessor to which the detector elements are connected and which forms the desired combination from the detector signals presented and derives control signals for both corrections therefrom.

Figure 2:
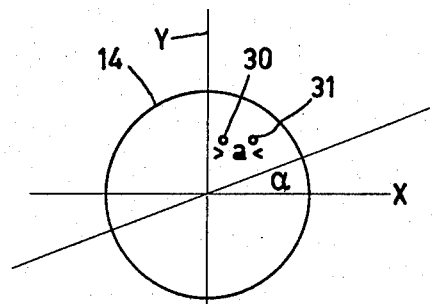
Figure 3:
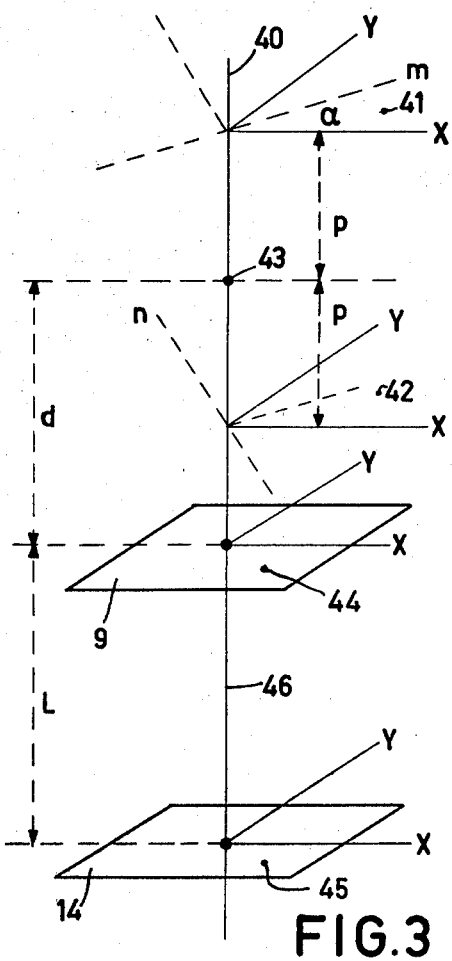

Some embodiments in accordance with the invention will now be described by way of example with reference to the accompanying diagrammatic drawings, of which:

FIG. 1 shows an electron microscope in accordance with the invention, comprising a detector with a plurality of independently readable detector elements, FIG. 2 illustrates such a detector, viewed from the incident electron beam, and FIG. 3 is a diagram representing part of the electron-optical axis to illustrate the effects of an error in focusing and of astigmatism in the electron beam.

An electron microscope as shown in FIG. 1 comprises an electron source 1 with an anode 2 and a beam alignment system 3, a condensor lens 4, a stigmator 5, an objective lens 6, a beam scanning system 7, an object space 8 with an object plane 9, a diffraction lens 10, an intermediate lens 11, a projection lens 12, a film camera 13 and a detector 14 with a signal output line 15. All these components are accommodated in a housing 16 which is provided with an input electronical supply line 17 for the electron source and a viewing window 18 for observing a fluorescent screen 19. A vacuum pumping device 20, a plate camera 21 and a television monitor 22 may also be connected to the housing. The detector is furthermore connected to an electronic circuit 23 whereto a control circuit 24 for the electron-optical system, notably for the objective lens 6 and the stigmator 5, is connected.

In an embodiment which serves only for focus connection and which will be described first for the sake of clarity, the detector 14 comprises at least two individual detector elements 30 and 31 as shown in FIG. 2.

The detector element 30 and 31 are situated on the same side of a dividing line through the detector which is indicated as the Y-axis and whose direction corresponds to the frame direction of a television raster type scanning pattern by means of which an object is scanned. An X-axis, directed at right angles to the Y-axis, will therefore coincide with the line scanning direction of the scanning pattern. The origin of the x and y axes lies on the electron-optical axis of the microscope. The automatic adjustment of the focus of the electron beam spot on the object, can be represented as follows. In this context, scanning the object is considered as a movement of the object with respect to a stationary electron beam.

When an object structure moves at a speed s transversely with respect to the electron beam which is assumed to be stationary and which irradiates the structure, an intensity pattern produced by interference between the undisturbed electron beam and electrons deflected by the structure, will move in a detection plane at a speed v which is given by $v = L.s.d.^{-1}$, wherein L is the distance between the beam focus and the image plane or an equivalent distance when projection lens fields are situated between the beam focus and the image plane, and d is the error in the focusing distance, measured with respect to the structural object in the object plane, and is defined as positive in the case of underfocusing and negative in the case of overfocusing. In the case of underfocusing, the focus is situated beyond the object plane, and in the case of overfocussing it is situated in front of the object plane, viewed from the electron source. It appears from the equation that the direction of v is the same as the scanning direction s in the case of underfocusing, and that it has the opposite direction in the case of overfocusing. Preferably, a supporting film for the object which has to be present anyway, is chosen to have a structure to generate the required intensity pattern. A known method of measuring the movement of an intensity pattern, is by the determination of the time difference between correspondingly similar signals from two detector elements which are situated at a given distance from one another. Signals s1 and s2 from the detector elements 30 and 31 which are situated at a distance a apart in the x direction, for example, will exhibit a time difference time displacement $\Delta t$ which is given by $\Delta t = a.d. L^{-1}s^{-1}$. By measurement of $\Delta t$, a value can be obtained for $a.d.L^{-1}v^{-1}$ and since a, L and v are known, a value for d can be derived and used to form a connection control signal which is applied to a control circuit for a relevant spot-forming lens of the electron optical system in order to correct the focus.

An optimum value for the delay between the signals s1 and s2 can be obtained by determining the value and the sign of that value $\Delta t$ associated with a maximum value of the correlation function $y = \int s1(t).s2(t+\Delta t)dt$. The value $\Delta t$ thus found, forms a measure of the required focus correction signal. It may then be advantageous to construct the detector so that it comprises a plurality of detector elements which can be pair-wise selected so that both elements forming a selected pair, are situated in the same half of the detector at a given distance from one another in the x-direction.

In a further embodiment of an electron microscope in accordance with the invention, both focusing and astigmatism of the electron beam spot focussed on the object plane, can be corrected. To achieve this the detector preferably comprises a matrix of individually readable detector elements which are arranged, for example, in an orthogonal system of 5×5 elements. As hereinbefore described, a detector element pair can be selected from such a matrix in order to obtain a signal correcting the focus.

FIG. 3 is a diagram representing part of the electron-optical axis, and illustrates an electron beam situation in which both beam astigmatism and an error of focusing with respect to the object plane are present.

The figure shows, transversely with respect to an electron-optical axis 40, an x, y system of coordinates which corresponds to the raster type scan directions of the electron beam spot across an object, the line scan direction coinciding with the x-direction and the frame direction coinciding with the y-direction, first line focus m of the astigmatic beam, is shown located in a plane 41 and the other line focus n of the astigmatic beam is located in a plane 42. The planes 41 and 42 are respectively situated at equal distances in front of and behind a mean focus (cross-over region) 43 of the astigmatic electron beam. Also shown are an object plane 44 and a detection plane 45.

The astigmatism of a focussed electron beam is in general characterized by the orientation $\alpha$ of the mutually perpendicular focal lines m and n, for example, with respect to the system of x, y coordinates, and by distance 2p between the two line foci m and n, measured along the optical axis. It will be apparent from a general astigmatism formula that the movement of an intensity pattern in the detection plane, produced by scanning the structured object, when the object is scanned with the x axis directed along the line scan direction, will have a displacement component in the y direction if the electron beam exhibits a form of astigmatism which is obliquely oriented; as will be the case if the m, n system of coordinates does not coincide with the x, y system coordinates. The movement of the intensity pattern over the detection plane can also serve as an adjustment criterion for correcting both the focus and the astigmatism. From the general formula for the movement of the intensity pattern it can be deduced that, in the case of an object scan directed along the x-axis, to the x axis, to the respective pattern velocities, namely Ux in the x-direction and Uy in the y-direction in the detection plane; are given by;

$$Ux = -Ls (d + p \cos 2\alpha)(d^2 - p^2)^{-1}$$

$$Uy = -Ls \, p \sin 2\alpha (d^2 - p^2)^{-1}$$

From these formula, Ux and Uy can be determined, utilizing time difference measurements from respective pairs of detector elements which are spaced from one another in the x-direction and in the y-direction.

As a first step of the correction procedure, a series of d values is realized by a continuous or intermittent variation of the excitation of the relevant lens for spot focussing the beam throughout a range which includes the expected correct spot focus value and also includes the worst case position p of the line foci. From the movement equations it follows that the sign of both Ux and Uy will reverse simultaneously relative to the line scan direction, for $d=d1=1|p|$ and $d=d2=+|p|$, respectively. In the case of $d=d3=-p\cos 2\alpha$, however, only the sign of Ux will be reversed relative to the line scan direction. Optimum focussing using the condition $d=0$, is achieved by adjusting the lens excitation to the arithmetical mean value of the two energization current values associated with the lens excitation for d1 and d2, respectively. The reversals of pattern movement relative to the line scan, can be detected from the output representing the movement dependent time delay $\Delta t$ provided by the correlation arrangement described with reference to FIG. 2.

In an automatic correction circuit which is controlled by a microprocessor, use is advantageously made of the linear dependency of d on the lens current; of the fact that there is a direct relationship between p or p cos 2α and the lens current values associated with the various d values; and of the fact that the sign of p is unambiguously related to the sign of Uy.

The correction of astigmatism can be realized in two steps. During a first step, diagonal astigmatism is added in order to make the orientation of the astigmatism i.e. the orientation of the system of m, n coordinates, coincide with the system of x, y coordinates. From the movement pattern, the magnitude of the diagonal astigmatism is known; the sign reversal of Uy can be used as an additional check. When the orientation of the astigmatism is such that it coincides with the system of x, y coordinates, during a second step the distances p are reduced to zero by the addition of x-axis directed astigmatism of a magnitude $-p\cos 2\alpha$, for which the sign reversal of Ux can be used as a check. After execution of the successive correction steps, the focus of the electron beam is made optimal and the beam is rendered substantially free of astigmatism. The correction can be programmed for a microprocessor circuit and be performed continuously during normal measurements. Use can then be made of the image formation to be measured, without this image being disturbed in any way. A suitable lens for performing the corrections is described in J. Phys. D Apl. Physics Vol. 7, (1974), pages 805–814.

What is claimed is:

1. A method of providing at least one of automatic focus and astigmatism correction in an electron microscope comprising the steps of
   scanning an object in the object plane of an electron microscope with a spot-focussed electron beam,
   forming an electron interference pattern in a detector plane, said interference pattern being caused by interaction of said object with said electron beam,
   displacing said interference pattern over said detector plane in response to said scanning,
   sensing electron intensity at a plurality of individually spaced locations in said detector plane,
   processing sensed signals by at least comparing signals from a pair of spaced locations to determine displacement of said electron intensity pattern over said detector plane,
   wherein said step of comparing signals includes the steps of forming a correlation integral of the two signals with respect to time for different applied time delays, determining a time delay required to cause said correlation integral to become a maximum, and generating a correction control signal dependent on said determined time delay, and
   applying said correction control signal to correct energization of an electro-optical element of said electron microscope in order to provide at least one of an optimum focus condition and a predetermined amount of astigmatism correction to the electron beam scanning said object plane.

2. A method according to claim 1, wherein for focus correction said sensed signals are derived from a pair of locations spaced along a direction corresponding to a line scan direction of a line raster type scanning pattern.

3. A method according to claim 1, further comprising the steps of systematically modifying energization of at least one spot-focussing electron-optical element over a range of values including a predetermined optimum value, detecting at least one corresponding object scan related reversal of pattern movement which is related to at least one of the focussing condition and the presence of astigmatism, said step of detecting being carried out during said step of systematically modifying, identifying and storing corresponding values of said energization, and deriving one of said correction control signals in a predetermined manner from reversal related energization values in order to cause energization of electron-signal elements to provide at least one of optimum focus and a predetermined amount of astigmatism correction.

4. A method according to claim 1, wherein said electron interference pattern is formed in a support film supporting said object in said object plane.

5. An electron microscope comprising an electro-optical lens system including a stigmator,
   a structured object on an object plane,
   beam scanning means for scanning said object with an electron beam,
   detection means for detecting electrons after passing through said object, said detection means including a plurality of individual detector elements arranged in a detector plane to provide independent electrical output signals, and
   electrical control circuit means connected to said detector elements for comparing output signals from a pair of spaced detector elements in order to determine movement of an electron intensity pattern present in said detection plane of said detection means in a direction from one detector element to the other with reference to a corresponding electron beam scan of said structured object,
   said electrical control circuit including first circuit means for forming a correlation integral of signals from said pair of spaced detector elements with respect to time for different applied time delays, second circuit means for determining a time delay required to cause said correlation integral to become a maximum, and third circuit means for generating a correction control signal dependent on said determined time delay to control energization of a corresponding electro-optical element controlling said electron beam before said object plane in order to provide at least one of an optimum focus condition and a predetermined amount of astigmatism correction.

6. An electron microscope according to claim 5, wherein said beam scanning means is arranged to scan said object with a line raster scanning pattern, wherein said detection means includes at least two of said individual detector elements spaced at a predetermined distance from one another along a direction corresponding to a line scan direction of said beam scanning means in order to provide a focus correction, said detector elements being located on the same side of a detector dividing line through the electro-optical axes of said microscope and directed at right angles to a line scan direction, and wherein said electrical control circuit means generates said correction control signal in response to a determination using said signals from said detector elements, said electrical control circuit means controlling energization of a spot forming lens of said electro-optical lens system.

7. An electron microscope according to claim 6, wherein for correcting astigmatism said detection means includes at least one further individual detector element in order to form a further pair of individual detector elements being spaced at a given distance from one another along a direction at right angles to the line scan direction, and wherein said electrical control circuit means generates in response to respective ones of determinations, using signals from corresponding pairs of said detector elements spaced at right angles to one another, correction control signals which are applied to said stigmator.

8. An electron microscope according to claim 7, wherein said electrical control circuit means is initially arranged to generate a control signal causing a systematic variation of energization of a spot-focussing electro-optic lens element acting on said electron beam before said object plane, said variation covering a range of values including a predetermined optimum value, and wherein means are provided for sensing any reversal of movement relative to said line scan in order to identify and store energization values corresponding to the detected reversal, said means subsequently generating a correction control signal from stored energization values.

9. An electron microscope according to claim 5, wherein said electrical control circuit means includes means for determining delay time corresponding to a maximum value for a time dependent correlation function relating to respective signals from a spaced pair of said detector elements, said delay time being employed as a measure for the correction control signal.

10. An electron microscope according to claim 5, wherein said detection means includes an orthogonal matrix of said detector elements.

11. An electron microscope according to claim 5, wherein said structured object includes a support film to support said object in said object plane.

* * * * *